United States Patent

Jain et al.

[11] Patent Number: 5,930,586
[45] Date of Patent: Jul. 27, 1999

[54] METHOD AND APPARATUS FOR IN-LINE MEASURING BACKSIDE WAFER-LEVEL CONTAMINATION OF A SEMICONDUCTOR WAFER

[75] Inventors: Ajay Jain; Robert L. Hance, both of Austin, Tex.

[73] Assignee: Motorola, Inc., Schaumburg, Ill.

[21] Appl. No.: 08/887,696

[22] Filed: Jul. 3, 1997

[51] Int. Cl.⁶ .......................... G01R 31/26; H01L 21/66
[52] U.S. Cl. .................. 438/14; 438/15; 438/16; 324/537; 324/765
[58] Field of Search .................. 438/14, 15, 16

[56] References Cited

U.S. PATENT DOCUMENTS

| | | | |
|---|---|---|---|
| 4,981,815 | 1/1991 | Kakoschke | 438/14 |
| 5,233,191 | 8/1993 | Noguchi et al. | 438/16 |
| 5,463,459 | 10/1995 | Morioka et al. | 438/16 |
| 5,483,568 | 1/1996 | Yano et al. | 438/16 |
| 5,575,885 | 11/1996 | Hirabayashi et al. | 438/14 |

*Primary Examiner*—Kevin M. Picardat
*Assistant Examiner*—D. Mark Collins
*Attorney, Agent, or Firm*—Keith E. Witek

[57] ABSTRACT

A method and apparatus for detecting copper (Cu) contamination on the backside of a wafer (120) begins by providing the wafer (120). The wafer (120) is rotated about a rotational axis via a motor/computer controlled wafer stage (118). In addition to rotation of the wafer (120), motor/computer control of a monochromator (116) is used to raster scan an X-ray beam (114*b*) across a surface of the rotating wafer (120). A plurality of X-ray detectors (122) are arrayed in one or more rows in close proximity to the scanned surface of the semiconductor wafer (120). The detectors (122), detect X-ray fluorescence emission from the surface of the wafer (120) whereby copper contamination of the wafer (120) can be determined in an accurate and time efficient manner which enables contamination detection in-line with normal wafer processing.

30 Claims, 2 Drawing Sheets

METHOD AND APPARATUS FOR IN-LINE MEASURING BACKSIDE WAFER-LEVEL CONTAMINATION OF A SEMICONDUCTOR WAFER

FIELD OF THE INVENTION

The present invention relates generally to semiconductor manufacturing, and more particularly to, monitoring contamination during the manufacture of integrated circuits (ICs) on a semiconductor wafer.

BACKGROUND OF THE INVENTION

The use of metal interconnects in the semiconductor industry is nearly unavoidable in the integrated circuit (IC) manufacturing process. However, the formation of metal interconnects, specifically using copper (Cu), is known to cause contamination problems on the backside of the semiconductor wafers. Backside metal contamination allows for subsequent contamination of other processing chambers in a semiconductor manufacturing facility. This cross-contamination of other chambers results in the contamination of active surfaces of semiconductor wafers in later processing steps. In other words, a single copper contaminated chamber may affect front end and/or backend processing of hundreds of subsequent wafers.

One specific way in which backside metal contamination can contaminate an entire wafer begins by a wafer going through copper deposition and copper planarization processing, such as copper Chemical Mechanical Polish (CMP) processing. Following the CMP process the wafer is scrubbed before progressing to the next processing steps. One example of a subsequent series of steps would be the lithographic processing of the wafer using photolithographic tracks. When a backside contaminated wafer is introduced into the photolithography system, the contamination transfers onto the photolithographic chambers and tracks. This contamination of the photolithography tool allows subsequent wafers that use the tool to be contaminated with copper. This is particularly troublesome when a wafer, that has not completed high temperature front end manufacturing, is exposed to the copper contamination. Copper contamination is readily vaporized at high temperature and will, after vaporization, contaminate active surfaces of wafers in the thermal processing tube as well as the walls of the thermal processing tube.

The migration of contaminants to the device areas causes device failures because of the incorporation of the copper metal into the active areas of semiconductor substrates. The vaporized metal can coat the surfaces of the high temperature furnaces thus also contaminating the subsequent wafers processed through the same chamber. This "snowball" contamination effect needs to be prevented to maintain higher yields through an IC fabrication facility.

FIG. 1 illustrates a tool 10 which is a Total Reflection X-ray Fluorescent system (TXRF) known in the art. The TXRF system 10 is used to measure contamination at specified point on the backside of a wafer 20. The TXRF system comprises an anode X-ray source 12, a monochromator 16, a sample stage 18, a scintillation counter 26, a solid state detector 22, and an amplifier 24.

In operation, the anode X-ray source 12 produces X-rays which are targeted at the monochromator 16. The monochromator is used to filter out all but a specified wavelength of the X-ray signals, and focuses this specified X-ray signal to a specified point on the wafer 20. The reflected X-ray signal is represented by X-ray portion 14b and is reflected off of the monochromator 16 such that reflected X-ray portion 14c has a very shallow angle of incidence relative to the wafer surface 20. Reflected X-rays 14c from the wafer 20 are received at the scintillation counter 26. The scintillation counter 26 is used to detect the actual reflection angle of the signal 14c as received from the wafer 20. The scintillation counter 26 is connected to the sample stage 18 such that the wafer's position/angle can be controlled so that the angle of incidence (between X-ray 14b and the wafer) equals the angle of reflection (between X-ray signal 14c and the wafer 20). Once the angle of incidence of affected X-ray signal 14b is equal to the angle of reflection of 14c, it is possible for the scintillation counter 26 to orient the detector 22 and it's amplifier 24 such that it is normal to the point upon the wafer which is being tested for contamination.

The TXRF tool 10 requires approximately 1000 seconds in order to monitor a 4 $mm^2$ location on a semiconductor wafer to determine whether or not a contaminant is present in this small 4 $mm^2$ location. At less than 1000 seconds, an inadequate confidence level is obtained. Because a single 4 $mm^2$ area on an 8 inch wafer is an insignificant surface area from which to determine whether or not contamination exists across an entire wafer, a number of regions need to be tested in a time serial manner by the device of FIG. 1. Typically, a minimum of five points on the backside of an 8-inch wafer would need to be tested in order to determine if excessive contamination is present on the wafer. Therefore, a total of 5000 seconds, or approximately 80 minutes, is needed in order to accurately determine whether or not a contamination potentially exists. The ramification of requiring this amount of time to determine whether or not contamination exists are several. One major ramification of the excessive detection time is that it is not feasible to test every wafer for contamination in an in-line process.

Therefore, statistical sampling needs to occur whereby one wafer every several hours would be pulled for testing. Worse yet, contamination may be checked only when a problem is detected with the tool. Both of these solutions may not detect hours of contamination thereby causing significant cross-contamination of fabrication tools and substantial yield reduction. Second, when a wafer is pulled for contamination check, other wafers are running through the tool in parallel to this testing. It would be possible for numerous wafers to be contaminated while the wafer is being checked due to the amount of time that has elapsed. For example, if a metal depositions/CMP processes takes 6 minutes per wafer, and the contamination detection takes 80 minutes per wafer; as many as 10 wafers could go through the metal deposition system and be adversely contaminated before the tested wafer could complete contamination analysis. Third, the limited area being checked on the backside of the area still results in the possibility that high levels of contamination or selectively placed contamination may exists on the wafer and go undetected. For example, if contamination were to exist on a portion of the edge of the wafer that was not chosen to be checked for contamination it would be possible for the wafer to be passed as a non-contaminated wafer, when in reality there was a significant amount of metal contamination which could cause "snowball" yield reduction if not corrected.

Therefore, it would be advantageous to develop a contamination detection system which: (1) is time-efficient in order to enable in-line contamination detection in a semiconductor manufacturing process; and (2) tests a significant portion of a wafer for contamination so that contamination detection is more comprehensive.

Figure 1:
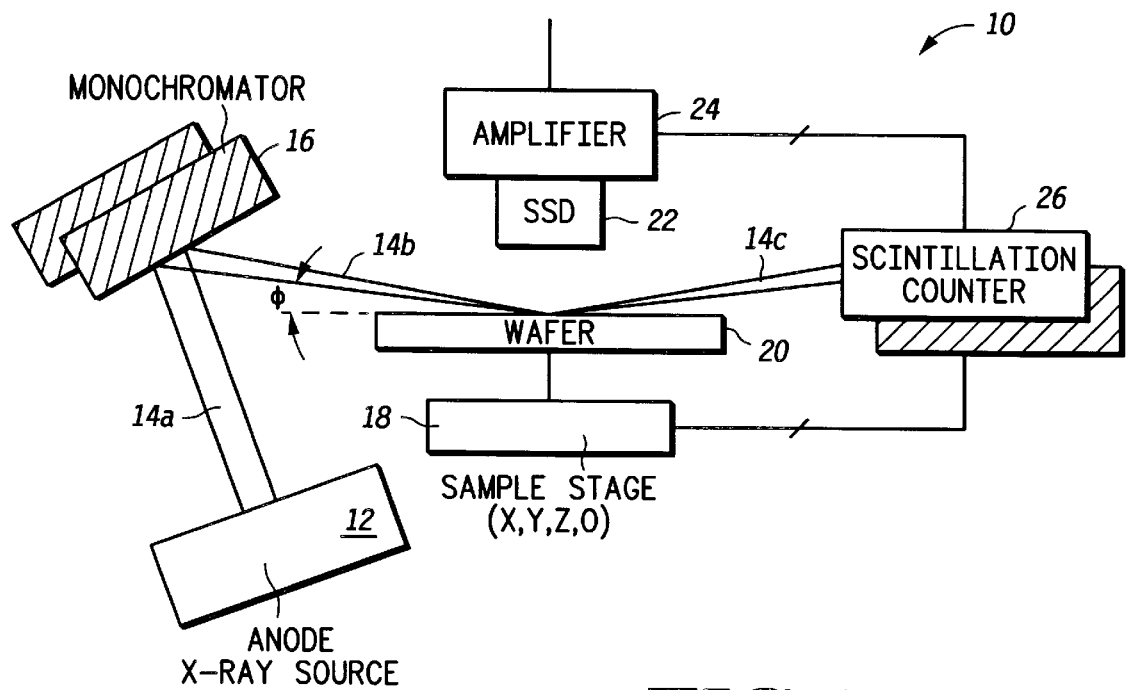
FIG. 1 illustrates, in a block diagram, a prior art contamination detection system.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

The present invention is an improved Total Reflection X-ray Fluorescent system (TXRF system) system for detecting copper contamination on the backside of a wafer. The present system uses an oscillating monochromator in order to raster scan a focused X-ray beam across the diameter of a wafer. By scanning the X-ray beam across the diameter of a wafer while simultaneously rotating the wafer, the single point detection of the prior art is changed into a two-dimensional contamination detection system over a larger wafer surface area. In addition, instead of using a single detector, as in the prior art, an array of solid state detectors is used in the present invention. Typically, X number of counts is needed by the detection device of the prior art system before a reasonably accurate contamination measurement is obtained with confidence. By using an array of solid state detectors (SSDs), better detection is obtained since the X number of counts is collected parallel in time by multiple detectors and is not collected in a time serial manner by one detector. The multiple rows or locations of additional detectors/sensors taught herein increases the solid state angle of detection of the system and reduces the scan time while maintaining similar confidence levels. Therefor, the combination of: (1) the oscillating monochromator and wafer rotation which enables X-ray raster scanning; and (2) the use of an array SSD's all working in parallel allows for greater detection for contamination across the wafer surface as well as a reduced overall scan time. Therefore, the device taught herein is timely enough to be incorporated in-line with mainstream wafer fabrication in order to increase IC yield, reduce facility contamination, and reduce financial loss.

In summary, the apparatus and method taught herein is an improvement over the prior art in that greater contamination detection is realized while reduced detection time is also realized. This allows for the use of the contamination detection method to be in-line with manufacturing processes and thereby gives greater reliability overall.

Figure 2:
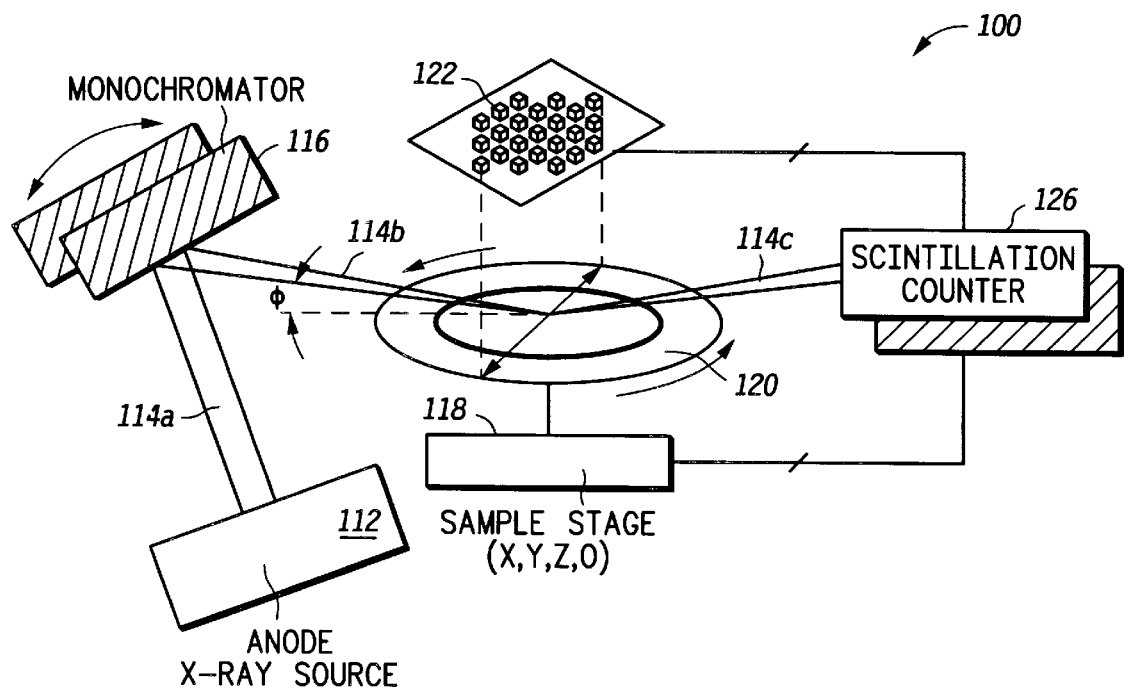
FIG. 2 illustrates, in a block diagram, an improved contamination detection system in accordance with the present invention.
Figure 3:
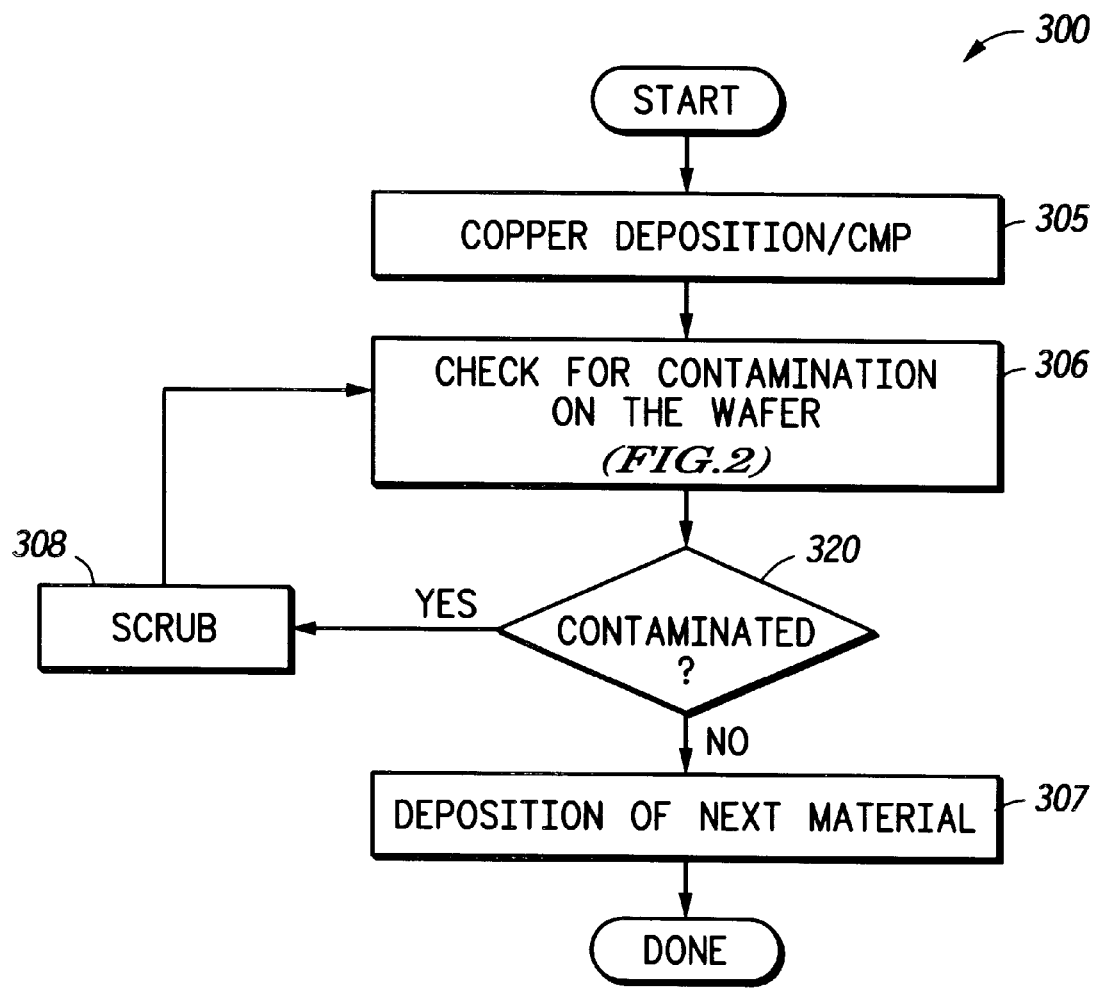
FIG. 3 illustrates, in a flow chart, a method for using the system of FIG. 2 to detect contamination in accordance with the present invention.

The invention can be further understood with reference to FIGS. 2–3 herein.

FIG. 2 illustrates an improved Total Reflection X-ray Fluorescent system (TXRF) system 100 in accordance with the present invention. The TXRF system 100 comprises an anode X-ray source 112, an oscillating monochromator 116 (i.e., any energy source reflector and/or focuser), a sample wafer stage 118, a scintillation counter 126, and an array of solid state devices 122. Note that the process and apparatus taught herein uses X-rays as an energy source, however, any other energy source which can detect contamination can be used herein.

In operation, the tool 100 generates an X-ray beam 114a from the anode X-ray source 112. The X-ray 114a is a typical an X-ray beam containing a number of X-ray wavelengths which is directed towards the monochromator 116. The monochromator 116 is used to filter and reflect the X-ray beam 114a to form a reflected X-ray beam 114b. The reflected X-ray beam 114b will generally be filtered by monochromator 116 to provide a single wavelength of X-ray as well as focusing the X-ray energy to a smaller point on the semiconductor wafer 120 (a point being an area of roughly 4 $mm^2$).

In the present invention, the monochromator 116 oscillates or rocks back and forth such that the beam is focused at different locations on the semiconductor wafer at different times. In a preferred embodiment, the beam would be focused across the diameter of the semiconductor wafer 120. It is important that the beam 114b be focused and raster scanned across the diameter of the semiconductor wafer through a raster scan path that crosses a center of the wafer. It is understood that the diameter would include the true diameter, which would be a straight line crossing the center of the wafer, or it could also include an arc-shaped pattern passing through the center of the semiconductor wafer which is substantially linear. It should be noted that the arc shaped scan across the wafer would be anticipated wherein the monochromator is being oscillated with reference to a single point thereby causing an arc to be formed across the semiconductor wafer. It is primarily important that the center point be checked in order to enable near 100% surface raster scan coverage. While 80% coverage or better is optimal, any raster scan process in excess of 50% wafer area coverage is far superior to the five-point test of the prior art.

By scanning from edge-to-edge over the wafer across a wafer diameter via motor control of the monochromator 116, an increased number of measurement points are capable of being detected in the contamination detection process taught herein. In conjunction with the X-ray beam 114b scanning across the diameter of the wafer 120, the wafer 120 is rotated on the wafer sample stage 118 by servo motor/computer control. By rotating the wafer via the stage 118 as well as raster scanning from edge-to-edge via monochromator 116, it is possible to detect contamination across a substantial portion of the backside wafer surface of wafer 120.

After the focused X-ray 114b impinges upon the wafer 120, the X-ray will reflect from the wafer surface to form the reflected X-ray beam 114c of FIG. 2. The scintillation counter 126 will monitor the angle of reflection of the X-ray beam 114c in order to determine if it is necessary to modify the orientation of the wafer 120 in order to assure the angle of incidence from X-ray beam 114b is equal to the angle of reflection as referenced to X-ray beam 114c. Typically, this angle ($\phi$) is typically maintained at an angle of less than 1°. The scintillation counter 126 of the present invention is used during a set-up process in order to match the angle of incidence to the angle of reflection of the X-ray beam. Generally, once set-up it would not be necessary to further adjust the wafer 120 during the contamination check procedure.

An array of solid state devices 122 is positioned directly above the scan path of the X-ray beam. In a first form, the array of devices 122 is a straight or nearly straight row of solid state detectors (SSDs). In another form, the sensors 122 may be arrayed into a plurality of rows in parallel to one another where each row contains a plurality of solid state detectors (SSDs). As previously discussed, the placement of the solid state detectors (SSDs) will generally be above the center diameter of the wafer itself and parallel to the raster motion of the X-ray as created by the motor controlled motion of the monochromator 116. Currently, the use of SSDs requires cooling to liquid nitrogen temperatures. Therefore, in a preferred embodiment, it is anticipated that the array of SSDs will be fixed in space due to the physical limitations of the equipment overhead necessary to maintain the appropriate sensor temperature. This low temperature is needed to assure proper detection of reflected X-ray energy levels (e.g., generically referred to as an energy signature). Therefore, in a preferred form, the array of SSDs will remain fixed while the X-ray beam itself is scanned across the diameter of the wafer. By using an array of SSDs, an increased angle of energy detection is allowed over the prior art, which used a single point of detection. While a single point can only detect counts in a time serial manner, the parallel detectors of FIG. 2 allows for parallel count detection whereby testing time can be reduced without sacrificing measurement confidence. Therefore, by using the increased angle of detection it is possible to significantly reduce the amount of time needed in order to detect contamination on a wafer. Generally, it is believed that an entire test for an 8-inch wafer could be conducted in under 500 seconds, and it is believed to be possible to detect the contamination with adequate ranges of confidence in under 100 seconds per wafer. Over the prior art, this would prove to be more than an order of magnitude of improvement and therefore enable in-line use of this X-ray scanning process for copper contamination.

One of the important aspects of the present invention is the manner in which the wafer is moved in order to allow detection of all contamination over a substantial area of the surface of the wafer. While it is understood that it would be possible for the wafer to move in other manners than in a rotational manner, the rotational manner is a preferred embodiment. When rotating, an X-ray beam focused on the outer edge of the wafer will be subjected to greater linear movement than a beam focused near the center of the wafer. As a result, in one embodiment, the X-ray beam 114b could be focused to be at the outer edge of the wafer for a longer period of time than in the center. This could be done in such a manner that the beam would be focused on the outer edge for a period of time relative to the number of linear feet or inches of wafer it sees as compared to the center of the wafer. In this configuration the scanning sequence would ensure that the outer edge gets the same level of contamination detection as the center.

Another embodiment would start monochromator 116 raster placement at one edge of the wafer and slowly pick up movement speed toward the center as detection processing continues. In this embodiment a single scan across the diameter of the wafer would be used in order to detect contamination. In other words, the scan process taught herein could function in a method similar to reading information from a compact disk (CD) or a hard disk drive for a computer. The radial scan of the monochromator 116 would begin at one extreme (either the center of the wafer or the edge of the wafer) and move in increments to the other extreme (either the edge of the wafer or the center of the wafer, respectively). Once the monochromator moved one unit incrementally along this path, at least one rotation of the wafer would be allowed per incremental position. Therefore, the scan process would be much like a needle across a phonorecord or a laser reading head across a CD medium.

Yet another embodiment would allow the monochromator 116 to oscillate back and forth across the wafer at a faster rate than the rate of rotation. It would be important however, to make sure the rotation of the wafer and the oscillation of the monochromator do not "sink-up" such that a single path is traversed continuously across the wafer surface (e.g., a so-called "spirograph" effect). This spirograph effect would, in one synched pattern, create a FIG. 8 on the wafer wherein the X-ray beam continuously followed a FIG. 8 across the top of the wafer as opposed to incrementally scanning new areas of the wafer with each linear pass of the monochromator 116. Therefore, either a CD-type scan of the wafer or a cyclical, higher-speed raster may be used to perform the two-dimensional wafer scanning taught herein. Another advantage of the present invention is that center-to-edge distribution of contamination could also be detected and monitored in order to pinpoint where the contamination is occurring. Contamination location would be important to know in some cases, For example, if edge contamination is the primary source of failures through the apparatus of FIG. 2, then it could be deduced that the wafer holding mechanisms of a previous step are the contamination culprit and that a solution to the problem may be found in this part of a process chamber.

The array of solid state detectors (SSDs) 122 may be a linear array residing above the diameter of the wafer or it could be a two-dimensional array which could be diamond shaped, oval shaped, or circular shaped. The array of SSDs 122 may be an arrangement of parallel rows wherein each row contains one or more SSD(s). The larger the array of SSDs, the greater the level of detection and the less time it should take to complete the raster scan contamination test. Since the single SSD of the prior art required liquid nitrogen cooling, the overhead associated with adding an array of SSD's would require only minimal additional overhead. The fixed array of SSD's should at a minimum go from edge-to-edge of the semiconductor wafer over a substantial portion of wafer's diameter. However, in another embodiment, the array of SSD's would expand past the edge so that reflections beyond the edge of the semiconductor wafer could be detected as well. Placement of SSDs would be limited primarily by the angle of incidence of the X-ray being targeted in that the array. Sensors and the like should not extend so far past the wafer that the X-ray beam cannot be targeted and monitored appropriately.

Where a solid state detector (SSD) is used that would not require the liquid nitrogen cooling, and thereby be more mobile, it would be anticipated by the present invention for the SSD's to track the targeted X-ray beam on top of the wafer. In effect, the detectors would be oscillating across the wafer in synchronization with the X-ray beam. This would allow for a smaller array to be used and still allow for as great of X-ray fluorescence emission detection via sensors 122.

FIG. 3 illustrates a portion of a semiconductor flow implementing the present invention. In step 305, a metal (such as copper) is deposited onto a wafer to form dual in-laid interconnects or like copper structures. Chemical Mechanical polishing (CMP) is performed as is needed to make the final copper structure on a top of the semiconductor wafer. It should be noted that copper is of particular concern for this process since copper is readily diffusable into other areas and copper's potential for contamination is greater than that of other metals. However, it should be understood that the present invention would work for the detection of any metals such as aluminum, steel, stainless steel, iron, silver, gold, etc..

In the step 305, a preliminary mechanical scrub of the wafer is performed in order to attempt to remove and residual copper contamination off of the wafer 120. It is during this scrub the contaminants are hopefully removed from the wafer so that it may be subsequently processed. In step 306, a contamination scan is performed using the tool 100 of FIG. 2. After the scan of step 306, a step 320 is used to determine a level of the contamination as measured in step 306. If the contamination is too high whereby subsequent "snowball" contamination of other chambers and other wafers can result, then more scrubbing in addition to the preliminary mechanical scrub is initiated in a step 308. The steps of 306, 308, and 320 are performed in a circular fashion until the wafer is either cleaned or the wafer is determined to be scrap. If the wafer is determined to the contaminated in step 320, an operator may commence a chamber clean on copper deposition chamber to reduce subsequent copper contamination of subsequent wafers exposed to copper deposition. If the wafer 120 is not contaminated, the flow proceeds to step 307 where the next material is deposited on the wafer 120 (typically an inter-level dielectric layer or a passivation layer) or other processing steps are performed.

It important to note that the step 320 would anticipate the fact that at some point in time it may be determined that a wafer is so contaminated it can not be properly cleaned at which it would be scrapped. As a part of the contamination step equipment may also be re-calibrated and checked for contamination problems.

Although the invention has been described and illustrated with reference to specific embodiments, it is not intended that the invention be limited to those illustrative embodiments. Those skilled in the art will recognize that modifications and variations may be made without departing from the spirit and scope of the invention. Therefore, it is intended that this invention encompass all of the variations and modifications as fall within the scope of the appended claims.

What is claimed is:

1. A method for measuring contamination on a semiconductor wafer, the method comprising the steps of:

processing a first surface of the semiconductor wafer to form a layer of material on the semiconductor wafer;

placing the semiconductor wafer into a contamination detection chamber;

scanning a second surface of the semiconductor wafer with an energy source wherein the semiconductor wafer and the energy source are moved with respect to one another to result in a raster scanning of a surface area of the semiconductor wafer;

detecting an energy signature from the semiconductor wafer in response to the step of scanning; and using the energy signature to determine if the semiconductor wafer is within a contamination specification.

2. The method of claim 1 wherein the step of scanning the semiconductor wafer comprises:

scanning the semiconductor wafer wherein the energy source is an X-ray beam which creates X-ray fluorescence emission as the energy signature.

3. The method of claim 2 wherein the step of scanning the semiconductor wafer comprises:

scanning the semiconductor wafer wherein the X-ray beam is impinged upon a surface of the semiconductor wafer at a angle of less than one degree off of a surface of the semiconductor wafer.

4. The method of claim 1 wherein the step of scanning the semiconductor wafer comprises:

changing a position of an energy source reflector to raster scan the energy source across a measurement area of the semiconductor wafer.

5. The method of claim 4 wherein the step of scanning the semiconductor wafer comprises:

changing a position of the energy source reflector back and forth in a linear direction along a straight axis.

6. The method of claim 4 wherein the step of scanning the semiconductor wafer comprises:

rotating the semiconductor wafer on a wafer stage so that movement of the energy source reflector along with a rotation of the semiconductor wafer results in a two-dimensional raster scan of the energy source across a surface of the semiconductor wafer.

7. The method of claim 1 wherein the step of scanning the semiconductor wafer comprises:

rotating the semiconductor wafer on a wafer stage.

8. The method of claim 1 wherein the step of detecting an energy signature comprises:

providing a row of energy detectors adjacent the semiconductor wafer to detect the energy signature.

9. The method of claim 1 wherein the step of detecting an energy signature comprises:

providing a two-dimensional array of energy detectors comprising a plurality of rows of energy detectors adjacent the semiconductor wafer to detect the energy signature.

10. The method of claim 1 wherein the step of detecting an energy signature comprises:

detecting the energy signature from the scanning in a time period less than 500 seconds.

11. The method of claim 1 wherein the step of detecting an energy signature comprises:

detecting the energy signature from the scanning in a time period less than 100 seconds.

12. The method of claim 1 wherein the step of processing the semiconductor wafer comprises:

depositing the layer as a layer comprising copper.

13. The method of claim 12 wherein the step of processing the semiconductor wafer comprises:

chemically mechanically polishing the layer comprising copper before the step of scanning.

14. The method of claim 1 wherein the step of scanning the semiconductor wafer comprises:

scanning a backside of the semiconductor wafer which is opposite an active surface of the semiconductor wafer which is processed to contain active circuitry.

15. The method of claim 1 further comprising:

mechanically scrubbing a backside of the semiconductor wafer in order to remove contamination in response to determining that the semiconductor wafer is outside of the contamination specification in the step of using.

16. The method of claim 1 further comprising:

performing the step of scanning in-line with other wafer processing such that the scanning is performed between a first and second manufacturing step of the semiconductor wafer within an integrated circuit fabrication facility.

17. The method of claim 1 wherein the step of scanning comprises:

scanning more than 80% of a surface of the semiconductor wafer.

18. The method of claim 1 wherein the step of scanning comprises:

scanning the energy source from a central portion of the semiconductor wafer to an edge portion of the semiconductor wafer in incremental positions wherein each incremental position is fixed for a time period that allows at least one rotation of the semiconductor wafer.

19. An apparatus for measuring contamination on a semiconductor wafer, the apparatus comprising:

a wafer stage for supporting the semiconductor wafer and allowing the semiconductor wafer to be rotated;

an X-ray source for producing an X-ray beam;

an X-ray monochromator for reflecting the X-ray beam onto a surface of semiconductor wafer whereby the X-ray monochromator is capable of motion to enable raster scanning of the X-ray beam across the surface of the semiconductor wafer; and a plurality of sensors located in close proximity to the wafer stage for measuring an X-ray signature resulting from the raster scanning of the X-ray beam.

20. The apparatus of claim 19 wherein the plurality of sensors are arranged in a row across a length of the wafer stage.

21. The apparatus of claim 19 wherein the plurality of sensors are arranged into a plurality of parallel rows of sensors wherein each row of sensors lies along a length of the wafer stage.

22. A method for manufacturing a semiconductor wafer using in-line contamination monitoring, the method comprising the steps of:

providing a semiconductor wafer;

depositing a copper-comprising material over the semiconductor wafer;

polishing the copper-comprising material over the semiconductor wafer;

placing the semiconductor wafer into a contamination detection chamber;

scanning an X-ray beam across a surface of a backside of the semiconductor wafer semiconductor wafer, the scanning being performed by moving the X-ray beam relative to the surface of the backside of the semiconductor wafer while detecting X-ray fluorescence in an array of detectors in close proximity to the semiconductor wafer;

cleaning the semiconductor wafer using a mechanical scrubbing process if the semiconductor wafer is determined to be outside an acceptable copper contamination range; and continuing wafer processing by depositing a dielectric layer over the copper-comprising material on the semiconductor wafer.

23. The method of claim 22 wherein the step of scanning comprises:

performing the scanning in less than 500 seconds.

24. The method of claim 22 wherein the step of scanning comprises:

performing the scanning in less than 100 seconds.

25. The method of claim 22 wherein the step of scanning comprises:

providing a two-dimensional array of energy detectors comprising a several rows of energy detectors in parallel to one another, the several rows of energy detectors being adjacent the semiconductor wafer to detect the X-ray fluorescence.

26. The method of claim 22 wherein the step of scanning comprises:

scanning more than 80% of the surface of the semiconductor wafer by both moving an X-ray beam position and rotating the semiconductor wafer.

27. The method of claim 22 wherein the step of scanning comprises:

detecting the X-ray fluorescence by moving the X-ray beam from a central portion of the wafer to an edge portion of the semiconductor wafer in incremental positions wherein each incremental position is fixed for a time period that allows at least one rotation of the semiconductor wafer.

28. An apparatus comprising:

means for processing the semiconductor wafer to form a layer of material on the semiconductor wafer;

means for placing the semiconductor wafer into a contamination detection chamber;

means for scanning a surface of the semiconductor wafer with an energy source wherein the semiconductor wafer and the energy source are rotated with respect to one another to result in a raster scanning of a surface area of the semiconductor wafer;

means for detecting an energy signature from the semiconductor wafer in response to the step of scanning; and means for using the energy signature to determine if the semiconductor wafer is within a contamination specification.

29. The method of claim 1 wherein the first wafer surface is opposite the second wafer surface.

30. The method of claim 1 wherein the semiconductor wafer and the energy source are moved with respect to one another by rotating the wafer.

* * * * *